(12) United States Patent
Chu et al.

(10) Patent No.: US 6,403,494 B1
(45) Date of Patent: Jun. 11, 2002

(54) METHOD OF FORMING A FLOATING GATE SELF-ALIGNED TO STI ON EEPROM

(75) Inventors: Wen-Ting Chu, Kaohsiung; Di-Son Kuo, Hsin-Chu; Jack Yeh, Hsin-Chu; Chia-Ta Hsieh, Hsin-Chu; Chuan-Li Chang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 9 days.

(21) Appl. No.: 09/638,300

(22) Filed: Aug. 14, 2000

(51) Int. Cl.7 ............................................. H01L 21/00
(52) U.S. Cl. .................... 438/719; 438/257; 438/735
(58) Field of Search .................. 438/218, 229, 438/257, 262, 266, 299, 719, 724, 725, 735, 738, 740, 744

(56) References Cited

U.S. PATENT DOCUMENTS

| | | | |
|---|---|---|---|
| 5,330,938 A | 7/1994 | Carmerlenghi | 437/57 |
| 5,688,705 A | 11/1997 | Bergemont | 437/43 |
| 5,950,087 A | 9/1999 | Hsieh et al. | 438/264 |
| 6,017,795 A | 1/2000 | Hsieh et al. | 438/262 |
| 6,037,266 A * | 3/2000 | Tao et al. | 438/719 |
| 6,046,086 A | 4/2000 | Lin et al. | 438/264 |
| 6,214,741 B1 * | 4/2001 | Lee | 438/719 |
| 6,245,685 B1 * | 6/2001 | Sung et al. | 438/719 |

* cited by examiner

Primary Examiner—William A. Powell
(74) Attorney, Agent, or Firm—George O. Saile; Stephen B. Ackerman; Sergin O Ktay

(57) ABSTRACT

A method is disclosed for forming a split-gate flash memory cell where the floating gate of the cell is self-aligned to a shallow trench isolation (STI), which in turn makes it self-aligned to source and to word line. This will advantageously affect a shrinkage in the size of the memory cell. In a first embodiment, the close self-alignment is made possible through a new use of an anti-reflective coating (ARC) in the various process steps of the making of the cell. In the second embodiment, a low-viscosity material is used in such a manner so as to enable self-alignment of the floating gate to the STI in a simple way.

13 Claims, 6 Drawing Sheets

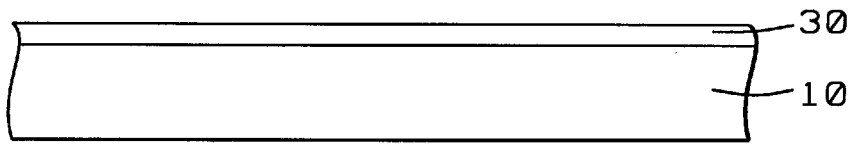
FIG. 1a - Prior Art
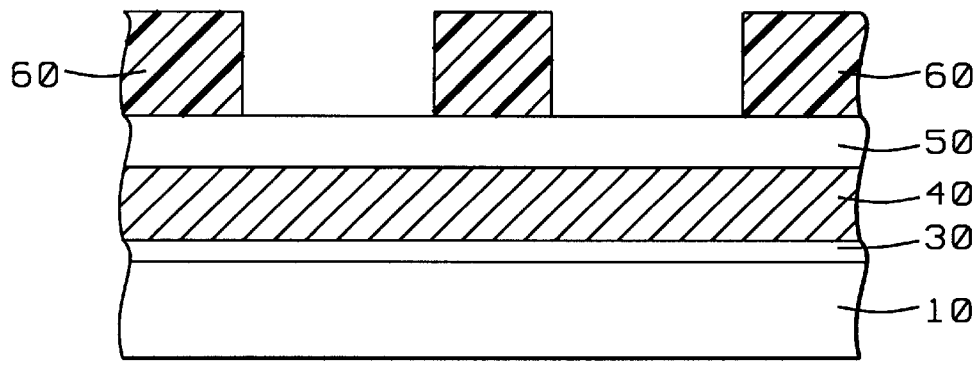
FIG. 1b - Prior Art
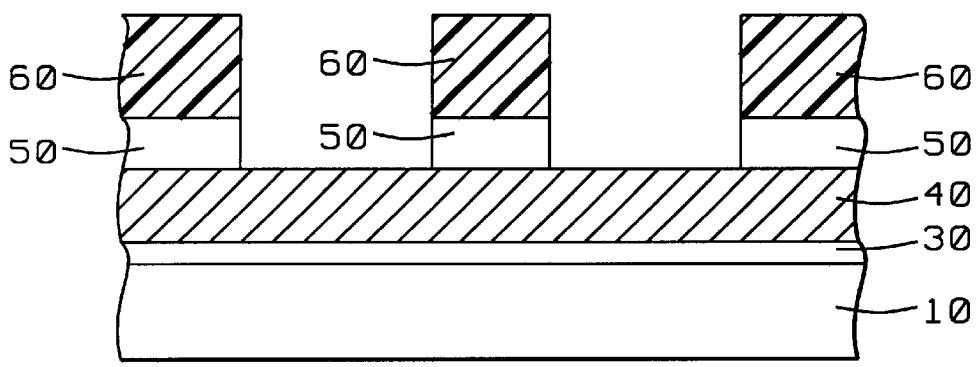
FIG. 1c - Prior Art
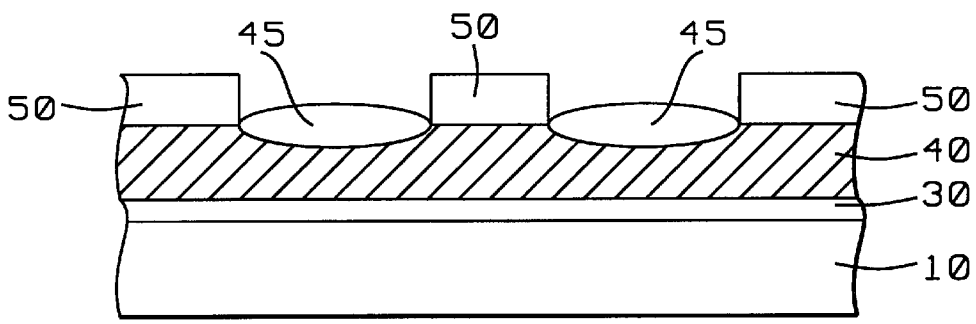
FIG. 1d - Prior Art

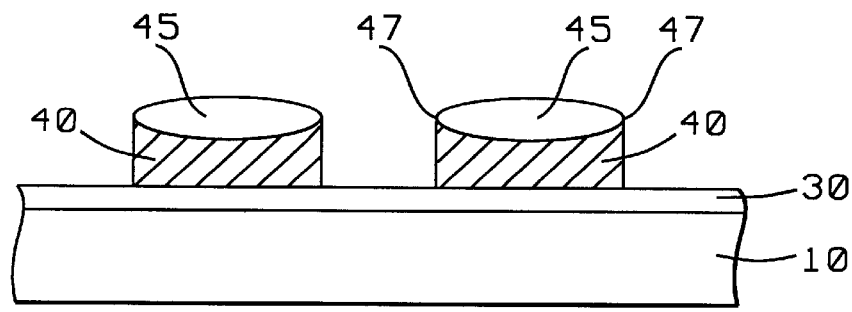
FIG. 1e – Prior Art
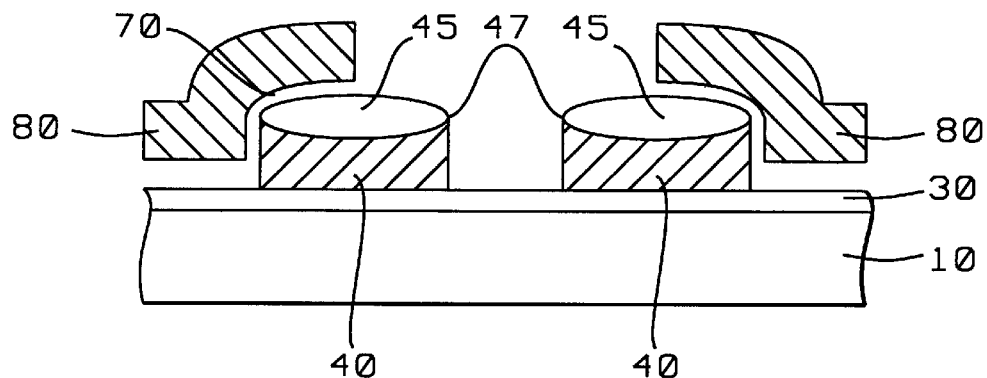
FIG. 1f – Prior Art
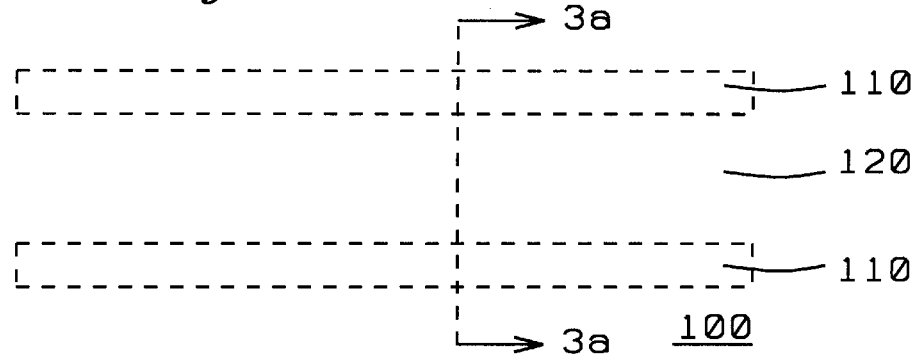
FIG. 2a
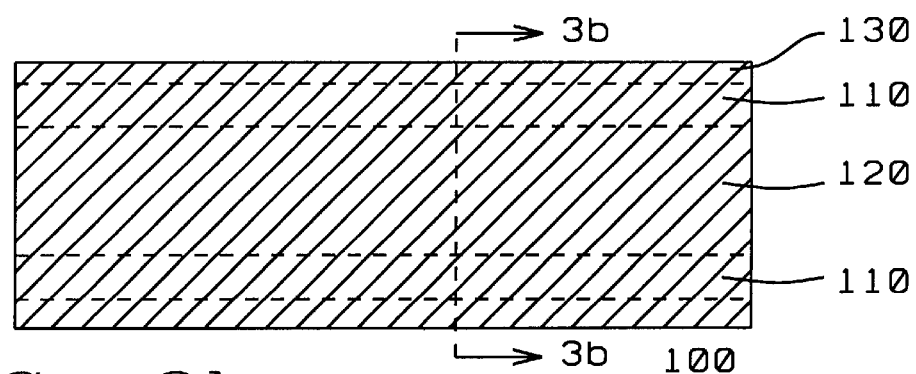
FIG. 2b

METHOD OF FORMING A FLOATING GATE SELF-ALIGNED TO STI ON EEPROM

BACKGROUND OF THE INVENTION (1) Field of the Invention

The present invention relates to split-gate memory cells used in flash EEPROMs (Electrically Erasable Programmable Read Only Memories), and in particular, to a method of forming a floating gate of a split-gate flash self-aligned to a shallow trench isolation (STI).

(2) Description of the Related Art

In the manufacture of split-gate flash memory cells, in particular, appropriate alignment tolerances must be factored into the design in forming floating gates over source regions of the cell. In general, self-alignment techniques are important in VLSI and ULSI (very large and ultra large scaled integrated) fabrication technology since they reduce the difficulties of precise alignment, and allow considerable shrinkage of the device size. A measure of the degree of shrinkage in each new generation of technology is the minimum gate length, for example, in MOS (metal-oxide-semiconductor) devices. At the same time, it is known that in order to assure proper MOS device operation, it is essential to have an overlap between the gate and the source/drain electrodes of the device in mask alignment during device fabrication. The overlap, on the other hand, is governed by the gate length. Thus, source and drain regions might not line up correctly relative to the gate, deposited contacts might not line up perfectly inside contact holes. It is disclosed later in the embodiments of the present invention a method of forming a floating gate self-aligned to shallow trench isolation regions that define the source regions of the cell.

One of the important drivers for increased performance in computers is the higher levels of integration of circuits. This is accomplished by miniaturizing or shrinking device sizes on a given chip. Tolerances play an important role in being able to shrink dimensions on a chip. Self-alignment of various components in a device can help reduce those tolerances and improve packing density of chips. As is known in the art, a split-gate flash memory cell normally has a floating gate, a control gate, source and drain regions, and none of them are usually self-aligned with respect to each other. That is, floating gate is not aligned to the cell isolation regions, nor to the common source line, nor to the control gate, or word line. This is primarily because of the poly oxide process employed in forming the floating gate. As it will be known to those skilled in the art, it is common practice to first form a poly-oxide over a polysilicon layer, and then use it as a hard-mask to etch the polysilicon to form a floating gate. However, the poly-oxide is usually thick and not dimensionally controllable, and hence the alignment of the floating gate to the underlying source region is not precise. It is disclosed later in the embodiments of the present invention a method of aligning the floating gate to the source through a judicious use of an organic antireflective coating (ARC) layer prior to the forming of the poly-oxide. With this method, mis-alignment and hence large tolerances are eliminated, and hence, the memory cell can be substantially reduced in size with the attendant improved packing density and performance.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMS) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

A method of forming a conventional split-gate flash memory cell is shown in FIG. 1a where a layer of gate oxide (30) is thermally grown over substrate (10). Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The photoresist layer, which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are cover ed by the polyoxide (FIG. 1e). As is well known in the art, this is usually accomplished by main etch followed by over-etch. It is at this etching step that the corner edge (47) is usually rounded off, as seen in FIG. 1e, which is not desirable for achieving precise alignment of the floating gate with the underlying source region. It will be shown later in the embodiments of this invention that by using an ARC layer, a much better self-alignment can be achieved than with the conventional poly-oxide hard-mask. Also, the sharpness of corner edge (47) can be improved such that charge transfer between substrate (10) and floating gate (40), and then the charge transfer between the floating gate and control gate, (80), is fast. The control gate is next formed by depositing a second polysilicon layer over intergate layer (70), also known as interpoly, which separates the two polysilicon layers, namely, the floating polygate and the control polygate. The completed split-gate cell structure is shown in FIG. 1f.

In prior art, various techniques have been employed to form split-gate flash memory cells, and also to achieve self-alignment between the floating gate and the source of the cell. Thus, in U.S. Pat. No. 5,330,938, Camerlenghi discloses a method of making non-volatile split gate EPROM memory cell and self-aligned field insulation. Here, the cell comprises a substrate with diffusions of source and drain separated by a channel area a floating gate superimposed over a first part of said channel area and a control gate formed by a first and a second polysilicon strip, respectively, a cell gate oxide between said floating gate and said first part of the channel area, a transistor gate oxide between said control gate and a second part of the channel area, an interpoly oxide between said floating gate and said control gate and a layer of dielectric filler. By means of a process which provides for self-aligned etchings of layers of polysilicon and of oxides there is obtained a floating gate and a control gate self-aligned with one another and with the diffusions of source and drain, as well as with the first oxide.

In another U.S. Pat. No. 5,688,705, Bergemont discloses a method for reducing the spacing between the horizontally adjacent floating gates of a flash EPROM array. The spacing between the horizontally-adjacent floating gates of a "T-shaped" flash electrically programmable read-only-memory (EPROM) array is reduced beyond that which can be photolithographically obtained with a given process by covering the layer of polysilicon that forms the floating gates with two sacrificial layers, exposing ships of the polysilicon layer with a standard photolithographic process, forming spacers that protect a portion of the exposed polysilicon layer and then etching the layer of polysilicon that remains exposed.

Hsieh, et al., on the other hand, teach in U.S. Pat. No. 6,017,795 a method of fabricating buried source to shrink cell dimension and increase coupling ratio in split-gate flash. The source line is formed in a trench in the substrate over the source region. The trench walls provide increased source coupling and the absence of gate bird's beak with the trench together shrink the cell size.

In still another U.S. Pat. No. 6,046,086, a method is provided for forming a split-gate flash memory cell having reduced size, increased capacitive coupling and improved data retention capability. In it, Lin, et al., also show a split-gate cell with appropriate gate oxide thicknesses between the substrate and the floating gate and between the floating gate and the control gate along with an extra thin nitride layer formed judiciously over the primary gate oxide layer in order to overcome the problems of low data retention capacity of the floating gate and the reduced capacitive coupling between the floating gate and the source of prior art.

In U.S. Pat. No. 5,950,087, a different method is provided by Hsieh, et al., for forming a common self-aligned source line in order to reduce the number of surface contacts and at the same time alleviate the field oxide encroachment into a memory cell area. Thus, the size of the split-gate flash memory is substantially reduced on both accounts. This is accomplished by forming a buffer polysilicon layer over the floating gate to serve as an etch stop to protect the first poly-oxide of the floating gate during the self-aligned source etching.

The present invention discloses a much different method of forming a self-aligned floating gate through the use of a layer different from the commonly used poly-oxide layer, as described later in the embodiments of the invention.

SUMMARY OF THE INVENTION

It is therefore an object of this invention to provide method of forming a floating gate self-aligned to shallow trench isolation (STI) in an EEPROM.

It is another object of the present invention to provide a method of forming a floating gate self-aligned to STI through a new use of an anti-reflective coating (ARC).

It is still another object of the present invention to provide a method of forming a floating gate self-aligned to STI through a new use of a low-viscosity material.

It is yet another object of the present invention to provide a method of forming a self-aligned floating gate in order to affect a reduction in the size of a split-gate flash memory cell.

These objects are accomplished by providing a semiconductor substrate having shallow trench isolation (STI) regions formed therein and active regions defined; forming a gate oxide layer over said substrate; forming a first polysilicon layer over said gate oxide layer; forming an anti-reflective arc coating (ARC) layer over said first polysilicon layer; partial etching of said ARC layer until portions of underlying said first polysilicon layer over said STI regions are exposed; partial etching of said exposed portions of said first polysilicon layer until underlying said STI regions are exposed, thus leaving said active regions in said substrate protected by said ARC layer; removing said organic ARC layer; forming a nitride layer over said substrate; patterning said nitride layer to form floating gate regions self-aligned to said STI regions until portions of said first polysilicon layer over said active regions are exposed; forming a poly-oxide by oxidizing said exposed portions of said first polysilicon layer; removing said nitride layer; etching remaining said first polysilicon layer by using said poly-oxide as a hard-mask; forming an interpoly oxide layer over said substrate, including over said poly-oxide; forming a second polysilicon layer over said interpoly oxide layer; patterning said second polysilicon layer to form , a control gate in completion of said split-gate of said invention.

These objects are accomplished further by providing a semiconductor substrate having shallow trench isolation (STI) regions formed therein and active regions defined; forming a gate oxide layer over said substrate; forming a first polysilicon layer over said gate oxide layer; forming a low-viscosity organic layer over said first polysilicon layer; partial etching of said low-viscosity organic layer until portions of underlying said first polysilicon layer over said STI regions are exposed; partial etching of said exposed portions of said first polysilicon layer until underlying said STI regions are exposed, thus leaving said active regions in said substrate protected by said low-viscosity organic layer; removing said low-viscosity organic layer; forming a nitride layer over said substrate; patterning said nitride layer to form floating gate regions self-aligned to said STI regions until portions of said first polysilicon layer over said active regions are exposed; forming poly-oxide by oxidizing said exposed portions of said first polysilicon layer; removing said nitride layer; etching remaining said first polysilicon layer by using said poly-oxide as a hard-mask; forming an interpoly oxide over said substrate, including over said poly-oxide; forming a second polysilicon layer over said interpoly oxide; patterning said second polysilicon layer to form a control gate in completion of said split-gate of said invention.

BRIEF DESCRIPTION OF THE DRAWINGS

FIG. 1a is a cross-sectional view of a portion of a semiconductor substrate showing the forming of a gate oxide layer, according to prior art.

FIG. 1b is a cross-sectional view of a portion of a semiconductor substrate showing the forming of a first polysilicon layer followed by a first nitride layer over the gate oxide layer of FIG. 1a, and the patterning thereof, according to prior art.

FIG. 1c is a cross-sectional view of a portion of a semiconductor substrate showing the patterning of the first nitride layer of FIG. 1b, according to prior art.

FIG. 1d is a cross-sectional view of a portion of a semiconductor substrate showing the forming of polyoxide over the polysilicon layer of FIG. 1c, according to prior art.

FIG. 1e is a cross-sectional view of a portion of a semiconductor substrate showing the etching of the first polysilicon layer of FIG. 1d to form a floating, according to prior art.

FIG. 1f is a cross-sectional view of a portion of a semiconductor substrate showing the forming of the control gate of the cell of FIG. 1e, according to prior art.

FIGS. 2a–2g show the top view of a portion of a semiconductor substrate of this invention, while

More specifically,

FIGS. 2a–3a are top and cross-sectional views, respectively, of a semiconductor substrate showing the forming of a shallow trench isolation (STI) region and an active region of the memory cell of the present invention followed by the forming of a gate oxide layer, according to the present invention.

FIGS. 2b–3b are top and cross-sectional views, respectively, of a semiconductor substrate showing the forming of first polysilicon layer over the substrate of FIGS. 2a–3a, according to the present invention.

FIGS. 2c–3c are top and cross-sectional views, respectively, of a semiconductor substrate showing the new use of an anti-reflective coating (ARC) or a low viscosity organic material in the self-alignment of the floating gate to be formed later in the process steps, according to the present invention.

FIGS. 2d–3d are top and cross-sectional views, respectively, of a semiconductor substrate showing the self-alignment of a floating gate to the STI through the use of ARC and organic material of FIGS. 2c–3c, according to the present invention.

FIGS. 2e–3e are top and cross-sectional views, respectively, of a semiconductor substrate showing the forming of a nitride layer over the substrate of FIGS. 2d–3d, according to the present invention.

FIGS. 2f–3f are top and cross-sectional views, respectively, of a semiconductor substrate showing the forming of poly-oxide over the self-aligned floating gate of FIGS. 2e–3f, according to the present invention.

Figure 2C:
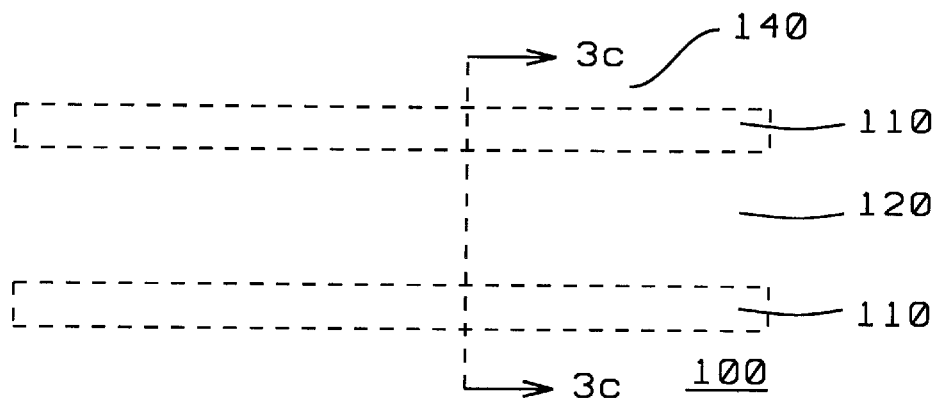
Figure 2D:
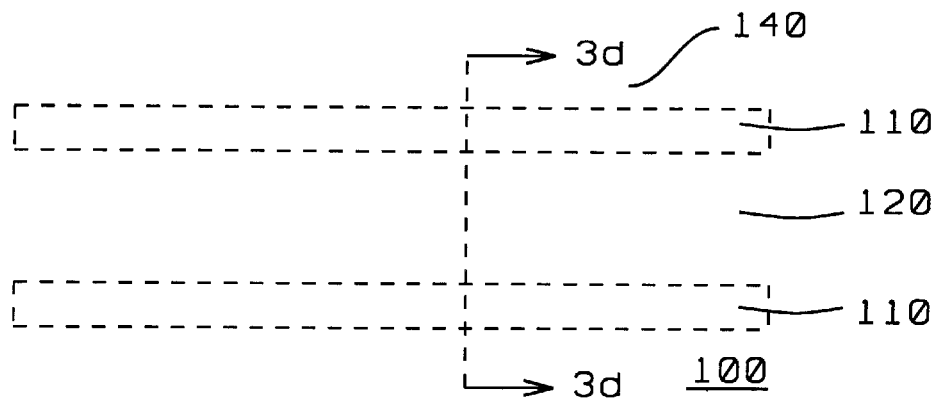
Figure 2E:
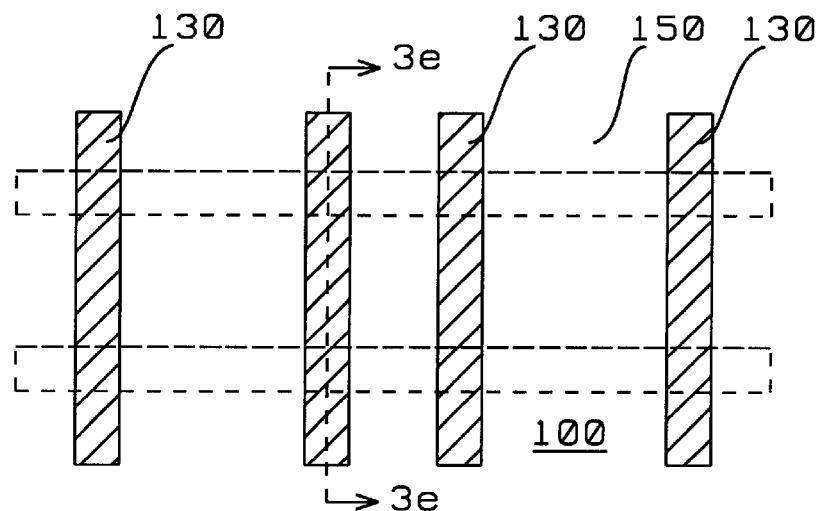
Figure 2F:
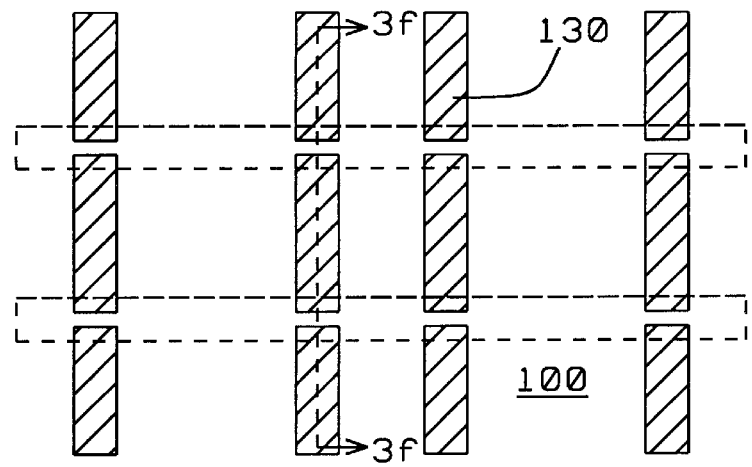
Figure 2G:
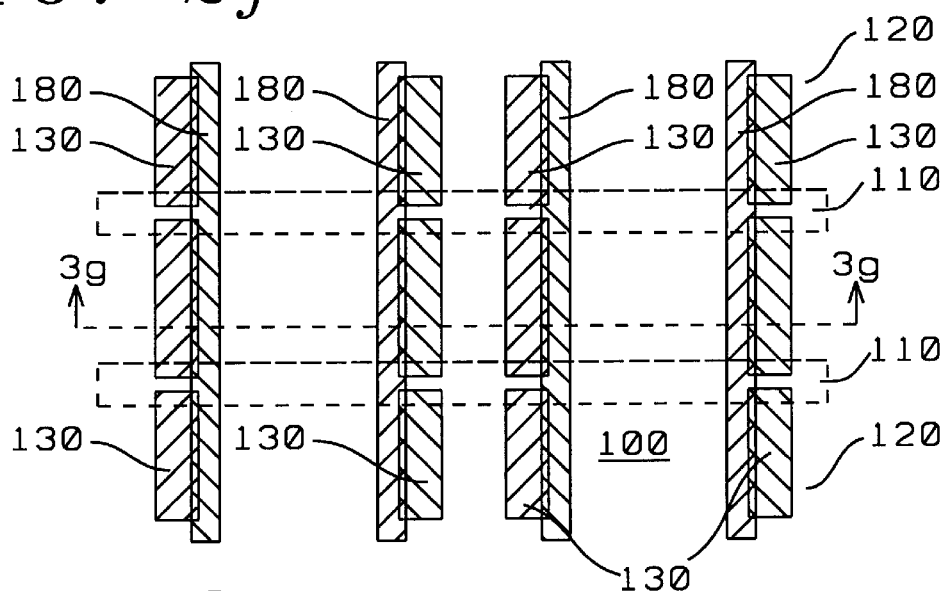
Figure 3A:
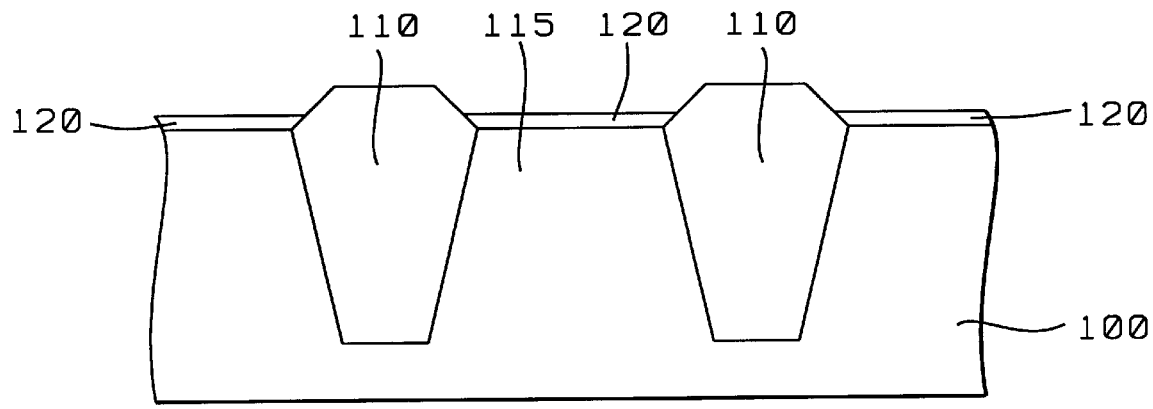
FIGS. 3a–3g show cross-sectional views of the same substrate.
Figure 3B:
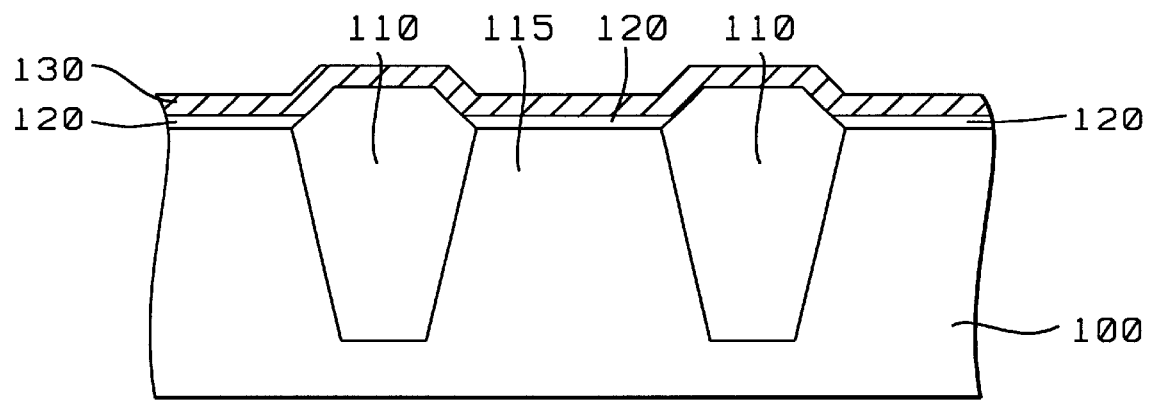
Figure 3C:
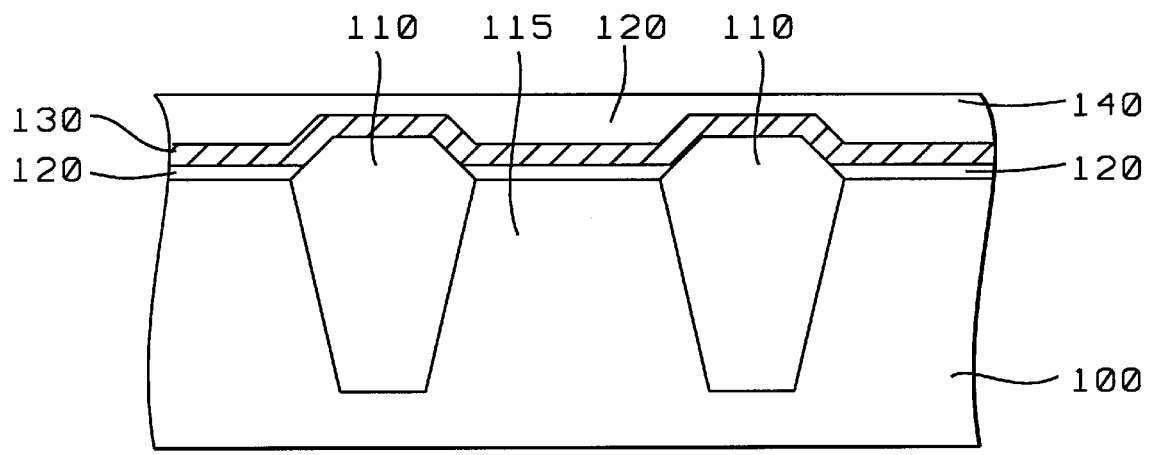
Figure 3D:
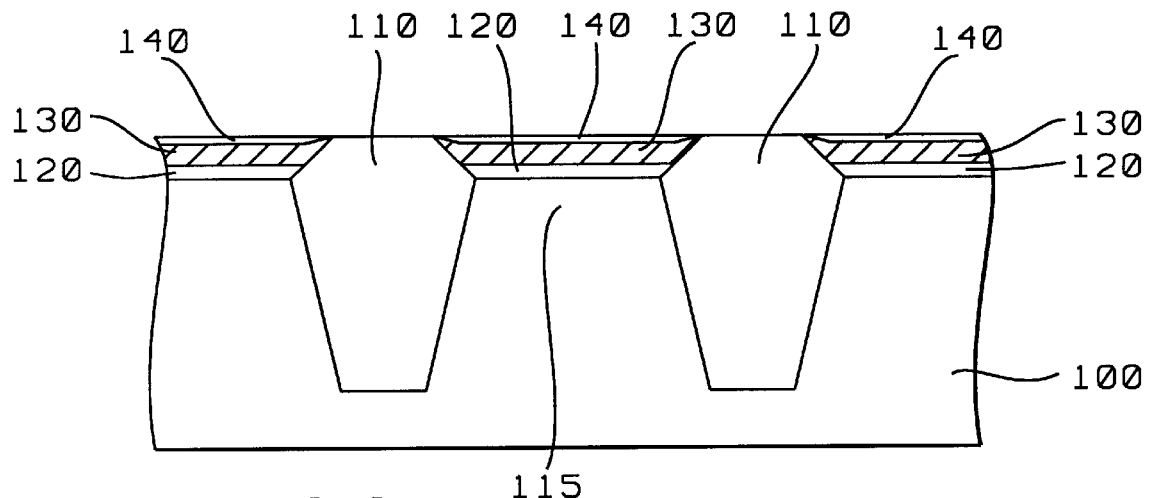
Figure 3E:
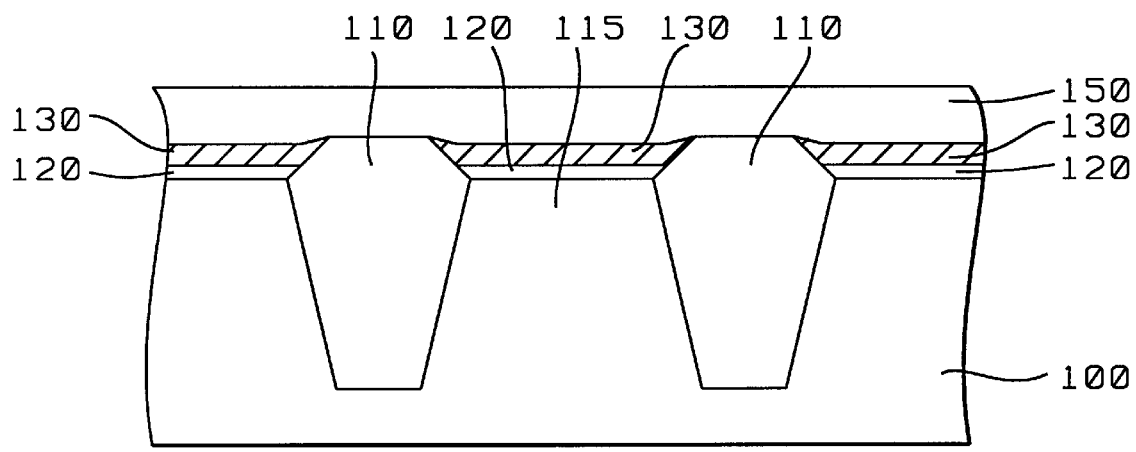
Figure 3F:
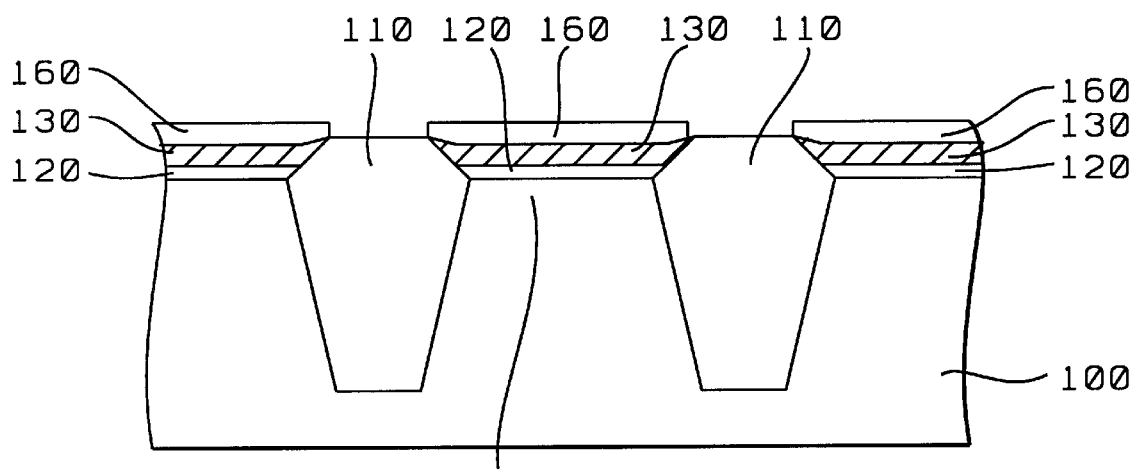
Figure 3G:
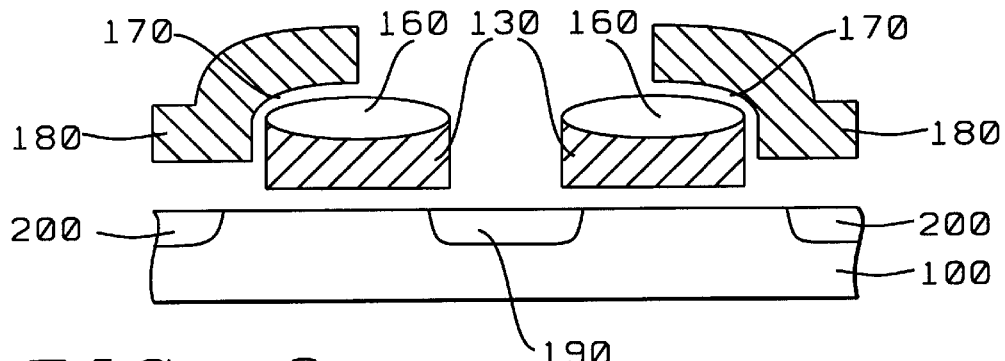

FIGS. 2g is a top view of substrate of FIG. 2f while FIG. 3g is a transverse cross-sectional view of a portion, showing the completion of the self-aligned split-gate flash memory cell of the present invention.

DESCRIPTION OF THE PREFERRED EMBODIMENTS

Referring now to the drawings, in particular to FIGS. 2a–2g and FIGS. 3a–3g, there are shown schematically steps of forming a split-gate flash memory cell where the floating gate of the cell is self-aligned to a shallow trench isolation, which in turn makes it self-aligned to source and to word line. This will advantageously affect a shrinkage in the size of the memory cell.

The method discloses a new use of an anti-reflective coating (ARC) in one embodiment, and a new use of another low-viscosity material in a second embodiment of the invention, in the making of the floating gate self-aligned to the STI. FIGS. 2a–2g and FIGS. 3a–3g are applicable to both embodiments.

More specifically, FIGS. 2a–2g show the top views of semiconductor substrate (100), preferably silicon, at different process steps of forming the self-aligned split-gate flash cell of the invention. FIGS. 3a–3g are cross sections taken at the corresponding cuts shown in FIGS. 2a–2g.

Following methods well known in the art, substrate (100) is formed with shallow trench isolation (STI) regions (110) separating active device regions (115) as better seen in the cross-sectional view in FIG. 2a. Trench (110) has a depth between about 2000 to 5000 Å, and is filled with low pressure chemical vapor deposition (LPCVD) oxide.

As shown in both FIGS. 2a and 3a, gate oxide layer, (120), is formed over substrate (100). It is preferred that gate oxide (120)) has a thickness between about 60 to 150 angstroms (Å). It can be formed by thermal oxidation process at a temperature between about 650 to 1000° C. Alternatively, the gate oxide can be formed by an atmospheric or LPCVD process as is well known.

First polysilicon layer (130) is next formed over the gate oxide layer as shown in FIGS. 2b and 3b. First polysilicon layer (130) is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 520 to 680° C. The preferred thickness of the first polysilicon layer is between about 300 to 2000 Å.

Next, and as a main feature and key aspect of the present invention, a layer of anti-reflective coating (ARC)—layer (140) in FIGS. 2c and 3c—is formed over the substrate. The ARC layer is a polymer, and is preferably formed by spinning it o n t he substrate to a thickness between about 500 to 2000 Å. It is important that the ARC planarizes the substrate topography. Then, ARC layer (140) is etched partially until the etching stops on first polysilicon layer (130) over STI regions (110). The partial etching of the ARC layer is accomplished with a recipe comprising $O_2$ or $CF_4$. Then using a different recipe, the exposed portions of the polysilicon over the STI regions are etched until the STI regions are exposed, as seen better in FIG. 3d, corresponding to the top view shown in FIG. 2d.

It will be observed that with the new use of the ARC, the polysilicon layer over active region (115) is protected during the etching of the polysilicon elsewhere, such as over the STI regions. In this manner, the region over an active region where a floating gate will be formed at a later step is self-aligned precisely with respect to the STI regions, as shown in FIGS. 3d–3f. Thereafter, the ARC is removed.

After the removal of ARC layer (140), nitride layer (150) is formed over the substrate as shown in FIG. 3e. The preferred thickness of the nitride layer is between about 500 to 2000 Å and is formed by reacting dichlorosilane ($SiCl_2H_2$), or silane ($SiH_4$) at a temperature between about 650 to 800° C. Following known methods, the nitride layer is next patterned until the underlying polysilicon layer is exposed to define the floating gate region over the active region (115). The exposed portions of the first polysilicon layer (130) is seen better this time in the top view shown in FIG. 2e. The patterned nitride layer is then used as a mask to form poly-oxide in areas where the first polysilicon layer is exposed through the open patterned areas. This is accomplished by oxidizing the polysilicon at a temperature between about 800 to 1100° C. Thereafter, the nitride layer is removed, thus leaving the newly formed polyoxide (160) over the floating gate (130) over active region (115) as shown in FIG. 3f. A top view corresponding to FIG. 3f is shown in FIG. 2f. It will be appreciated by those skilled in the art that floating gate (130), with the poly-oxide cap over it, is now precisely self-aligned to STI as shown in FIG. 3f.

Next, a layer of interpoly oxide, layer (170) better seen in FIG. 3g, is formed over the substrate, preferably at a temperature between about 700 to 1100° C., and to a thickness between about 100 to 300 Å. Alternatively, other oxidation methods can be used, such as oxidation in a dry oxygen and anhydrous hydrogen chloride in an atmospheric or low pressure environment, or low temperature, high-pressure, and the like. This is followed by the forming of second polysilicon layer, which is then patterned to form the control gate of the split-gate flash memory cell of the invention. Control gate (180) is shown in FIG. 3g, as well as in the top view, FIG. 2g.

It will be apparent to those skilled in the art that the disclosed use of anti-reflective coating (ARC) (140) in the process steps depicted in FIGS. 2c–2d, and FIGS. 3c–3d makes it possible to cause self-alignment of floating gate (130) to STI regions (110). In a second embodiment, an organic material having a low-viscosity is used in place of the ARC as a main feature. The organic low-viscosity material is a polymer, and is also preferably formed by spinning on the substrate, and to a thickness between about 500 to 2000 Å.

Following the process steps as with ARC, now low-viscosity organic layer (140) is etched partially until the etching stops on first polysilicon layer (130) over STI regions (110). Then using a different recipe, the exposed portions of the polysilicon over the STI regions are etched until the STI regions are exposed, as seen better in FIG. 3d, corresponding to the top view shown in FIG. 2d.

It will be observed that with the new use of the organic low-viscosity material, the polysilicon layer over active region (115) is protected during the etching of the polysilicon elsewhere, such as over the STI regions. In this manner, the region over an active region where a floating gate will be formed at a later step is self-aligned precisely with respect to the STI regions, as shown in FIGS. 3d–3f. Thereafter, the organic low-viscosity material is removed.

Again, following the process steps as before, after the removal of organic low-viscosity layer (140), nitride layer (150) is formed over the substrate as shown in FIG. 3e. The nitride layer is next patterned until the underlying polysilicon layer is exposed to define the floating gate region over the active region (115), as shown in FIG. 2e. The patterned nitride layer is then used as a mask to form poly-oxide in areas where the first polysilicon layer is exposed through the open patterned areas. Thereafter, the nitride layer is removed as in the first embodiment, thus leaving polyoxide (160) over floating gate (130) over active region (115) as shown in FIG. 3f. It will again be appreciated by those skilled in the art that floating gate (130), with the poly-oxide cap over it, is now precisely self-aligned to STI as shown in FIG. 3f.

Next, a layer of interpoly oxide, layer (170), is formed, followed by the forming of second polysilicon layer (180), which is then patterned to form the control gate of the split-gate flash memory cell of the invention. Control gate (180) is shown in FIG. 3g, as well as in the top view, FIG. 2g.

It will be apparent to those skilled in the art that the disclosed use of organic low-viscosity layer (140) in the process steps depicted in FIGS. 2c–2d, and FIGS. 3c–3d makes it possible to cause self-alignment of floating gate (130) to STI regions (110), as is the case with the first embodiment where ARC is used as the protective layer in defining the floating gate region of the split-gate flash memory cell of the instant invention. In turn, the cell becomes self-aligned with respect to word line connecting control gates (180) and source/drain regions (190) and (200), as shown in FIGS. 2g and 3g.

While the invention has been particularly shown and described with reference to the preferred embodiments thereof, it will be understood by those skilled in the art that various changes in form and details may be made without departing from the spirit and scope of the invention.

What is claimed is:

1. A method of forming a floating gate self-aligned to a shallow trench isolation (STI) comprising the steps of:
    providing a semiconductor substrate having shallow trench isolation (STI) regions formed therein and active regions defined;
    forming a gate oxide layer over said substrate;
    forming a first polysilicon layer over said gate oxide layer;
    forming an anti-reflective arc coating (ARC) layer over said first polysilicon layer;
    partial etching of said ARC layer until portions of underlying said first polysilicon layer over said STI regions are exposed;
    partial etching of said exposed portions of said first polysilicon layer until underlying said STI regions are exposed, thus leaving said active regions in said substrate protected by said ARC layer;
    removing said ARC layer;
    forming a nitride layer over said substrate;
    patterning said nitride layer to form floating gate regions self-aligned to said STI regions until portions of said first polysilicon layer over said active regions are exposed;
    forming a poly-oxide by oxidizing said exposed portions of said first polysilicon layer;
    removing said nitride layer;
    etching remaining said first polysilicon layer by using said poly-oxide as a hard-mask;
    forming an interpoly oxide layer over said substrate, including over said poly-oxide;
    forming a second polysilicon layer over said interpoly oxide layer; and
    patterning said second polysilicon layer to form a control gate in completion of said floating gate of said invention.

2. The method of claim 1, wherein said gate oxide layer has a thickness between about 60 to 150 Å.

3. The method of claim 1, wherein said first polysilicon layer has a thickness between about 300 to 2000 Å.

4. The method of claim 1, wherein said ARC layer has a thickness between about 500 to 2000 Å.

5. The method of claim 1, wherein said nitride layer has a thickness between about 500 to 2000 Å.

6. The method of claim 1, wherein said interpoly oxide layer has a thickness between about 100 to 300 Å.

7. The method of claim 1, wherein said second polysilicon layer has a thickness between about 1000 to 3000 Å.

8. A method of forming a floating gate self-aligned to a shallow trench isolation (STI) comprising the steps of:
    providing a semiconductor substrate having shallow trench isolation (STI) regions formed therein and active regions defined;
    forming a gate oxide layer over said substrate;
    forming a first polysilicon layer over said gate oxide layer;
    forming a low-viscosity organic layer over said-first polysilicon layer;
    partial etching of said low-viscosity organic layer until portions of underlying said first polysilicon layer over said STI regions are exposed;
    partial etching of said exposed portions of said first polysilicon layer until underlying said STI regions are exposed, thus leaving said active regions in said substrate protected by said low-viscosity organic layer;

removing said low-viscosity organic layer;

forming a nitride layer over said substrate;

patterning said nitride layer to form floating gate regions self-aligned to said STI regions until portions of said first polysilicon layer over said active regions are exposed;

forming poly-oxide by oxidizing said exposed portions of said first polysilicon layer;

removing said nitride layer;

etching remaining said first polysilicon layer by using said poly-oxide as a hard-mask;

forming an interpoly oxide over said substrate, including over said poly-oxide;

forming a second polysilicon layer over said interpoly oxide; and patterning said second polysilicon layer to form a control gate in completion of said floating gate of said invention.

9. The method of claim 8, wherein said gate oxide layer has a thickness between about 60 to 150 Å.

10. The method of claim 8, wherein said low-viscosity organic layer has a thickness between about 500 to 2000 Å.

11. The method of claim 8, wherein said first polysilicon layer has a thickness between about 300 to 2000 Å.

12. The method of claim 8, wherein said interpoly oxide has a thickness between about 100 to 300 Å.

13. The method of claim 8, wherein said second polysilicon layer has a thickness between about 1000 to 3000 Å.

* * * * *

UNITED STATES PATENT AND TRADEMARK OFFICE
CERTIFICATE OF CORRECTION

PATENT NO.     : 6,403,494 B1
DATED          : June 11, 2002
INVENTOR(S)    : Wen-Ting Chu, Di-Son Kuo, Jack Yeh, Chia-Ta Hsieh and Chuan-Li Chang It is certified that error appears in the above-identified patent and that said Letters Patent is hereby corrected as shown below:

<u>Title page,</u>
Item [74], please delete "Sergin O Ktay", and replace it with -- Sevgin Oktay --.

Signed and Sealed this

Twenty-sixth Day of November, 2002

*Attest:*

*Attesting Officer*

JAMES E. ROGAN
*Director of the United States Patent and Trademark Office*